(12) United States Patent
Yang et al.

(10) Patent No.: US 7,319,043 B2
(45) Date of Patent: Jan. 15, 2008

(54) METHOD AND SYSTEM OF TRACE PULL TEST

(75) Inventors: Wen-Kun Yang, Hsin-Chu (TW); Cheng Chieh Tai, Hsin-Chu (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 44 days.

(21) Appl. No.: 11/235,485

(22) Filed: Sep. 26, 2005

(65) Prior Publication Data

US 2007/0069207 A1 Mar. 29, 2007

(51) Int. Cl.
*H01L 21/66* (2006.01)
(52) U.S. Cl. .......................... 438/17; 438/14; 324/765
(58) Field of Classification Search .................. 438/14, 438/106, 17; 324/500, 765
See application file for complete search history.

(56) References Cited

U.S. PATENT DOCUMENTS

| | | | | |
|---|---|---|---|---|
| 5,275,058 A * | 1/1994 | Pham et al. | ................... | 73/827 |
| 5,533,398 A * | 7/1996 | Sakurai | ......................... | 73/573 |
| 5,675,179 A * | 10/1997 | Shu et al. | .................... | 257/668 |
| 5,686,670 A * | 11/1997 | Vanderlip | ...................... | 73/827 |
| 6,094,144 A * | 7/2000 | Dishongh et al. | ............ | 340/653 |
| 6,133,052 A * | 10/2000 | Ichihara | .......................... | 438/7 |
| 6,452,502 B1 * | 9/2002 | Dishongh et al. | ............ | 340/653 |
| 6,568,581 B2 * | 5/2003 | Boller et al. | ................. | 228/103 |
| 6,758,385 B2 * | 7/2004 | Farassat | ....................... | 228/103 |
| 6,790,759 B1 * | 9/2004 | Wang et al. | ................. | 438/612 |
| 2005/0225344 A1* | 10/2005 | Kirby | .......................... | 324/755 |
| 2006/0103399 A1* | 5/2006 | Kuo | ............................ | 324/754 |
| 2006/0194353 A1* | 8/2006 | Spuhler et al. | ................ | 438/14 |

* cited by examiner

*Primary Examiner*—Evan Pert
*Assistant Examiner*—Victor A. Mandala, Jr.
(74) *Attorney, Agent, or Firm*—Kusner & Jaffe

(57) ABSTRACT

The present invention provides an efficient test method and system for testing the IC package, such as BGA types of packages. With the present invention, manufacturer can have an easier way in testing various types of packages, including newer types. Manufacturer also can get the testing outcome which is more accurate. Furthermore, the present invention helps the manufacturer achieve a significant improvement in an IC packaging process.

14 Claims, 4 Drawing Sheets

METHOD AND SYSTEM OF TRACE PULL TEST

FIELD OF THE INVENTION

This invention relates to a method and system for testing the RDL metal trace bonding strength and quality of packaged IC (integrated circuit), and more particularly to a novel method and system for testing the bonding strength and quality of wafer-level packaged IC (integrated circuit).

BACKGROUND OF THE INVENTION

The semiconductor technologies are developing very fast, especially for semiconductor dies which have a tendency toward miniaturization. Besides, the requirements for the functions of the semiconductor dies have an opposite tendency to variety. Namely, the semiconductor dies must have more I/O pads to a smaller area, so the density of the pins is raised quickly. It causes the packaging for the semiconductor dies to become more difficult and decrease the yield.

The main purpose of the package structure is to protect the dies from outside damages. However, the bonds of IC (integrated circuit) may be substantially impacted by the temperature variation during IC operating. In this situation, although the package is not damaged by external force, the IC still cannot perform its function properly. So it is necessary to test the bonding strength and quality of the packaged integrated circuit, in order to achieve a higher yield of the packaged IC.

With the purpose mentioned above, there is a way named "Wire Pull Testing" (WPT). Wire Pull Testing is one of several available time-zero tests for wire bond strength and quality. It consists of applying an upward force under the wire to be tested, effectively pulling the wire away from the die. There are several different failure modes of WPT, (1) first bond (ball bond) lifting; (2) neck break; (3) midspan wire break; (4) heel break; and (5) second bond (wedge bond) lifting. First or second bond lifting is unacceptable and should prompt the process operator to investigate why such a failure mode occurred. Nevertheless, with the improvement of IC package, there are many different types of package disclosed. The WPT can only apply to some traditional package like wirebonding BGA (Ball Grid Array), but cannot apply to some newer packages, such as Flip-Chip package. So the WPT method is inefficient and impractical.

To reach the purpose of testing BGA package, another way named "Ball Shear Testing (BST)" is provided. By applying a horizontal force on the bonding ball, such as solder ball, the bonding ball would be pushed in horizontal direction. There are six failure modes (by reference to JEDEC standard No. B117) of BST, which includes (1) Ball Shear (2) Pad Lift (3) Ball Lift: lack of solder wetting (4) Intermetallic Break (5) Shear Above Ball Centerline (6) Interference Setup Error. The first and second failure modes are acceptable, and others are unacceptable. Although this seems quite improved, it still has many disadvantages. For example, it is only suitable for Flip-Chip package but not applicable on a fan-in type and fan-out type wafer level packaging (FO-WLP) or other modified type of BGA package. The reason is that it will come out with undesired failure modes, such as the ball lifting at UBM (under bump metallurgy) which is between metal trace (Redistribution Layer, or RDL) and solder ball, but not the expected outcome which the broken part (UBM) is formed between bonding pad and trace.

In view of foregoing problems, it is urgently required to have a method and system for testing the bonding strength and quality of multiple-type package. The system with the aforementioned functions should be easy to upgrade and have a high reliability. The present invention therefore can match all the requirements.

SUMMARY OF THE INVENTION

The present invention fills the needs by providing a method and a system to test the bonding quality of dies. It should be appreciated that the present invention can be implemented in numerous ways, including as a process, a system, or a method. By using the method and system of the present invention, the manufacturer of package can truly find out the critical part of testing. Moreover, the manufacturer also can easily upgrade the yield of the package.

The purpose of the present invention is to determine the bonding quality of the package by measuring the strength which the bonding part can stand. By connecting the biases to conductive parts of the package, there will form a circuit loop. Then we apply an external force on bonding balls in vertical direction, and monitor the status of the circuit loop. The bonding ball will be deformed due to the external force applies on them and this external force will be indicated to the bonding pads by the elastic trace material. Then it will cause the deformation of the bonding parts and also the status of the formed circuit loop. When this circuit loop is in a closed condition, it means that all the bonds are still connected to each other. When this circuit loop is in an open condition, means that there are some parts broken within the package. At the same time, watching the difference of the external force, this can help the manufacture to determine the bonding quality of the package. Because the circuit loop is very sensitive, so we can consider the circuit loop as a trigger standing for the bonds breaking moment. By this circuit loop, we can exactly measure the bonding strength which the package can withhold.

Another purpose of the present invention is to determine the bonding quality of the package by measuring a dimension parameter of the bonding balls. By connecting the biases to bumps (conductive parts) of the package, there will form a circuit loop. Then we apply an external force on bonding balls in vertical direction, and monitor the dimension parameter of the deforming bonding balls. The bonding balls will be deformed because of the external force applied on the external force and the elastic material will form the trace layer. Then it will cause the deformation of the bonding parts and also the status of the formed circuit loop. When this circuit loop is in a closed condition, it means that all the bonds are still connected to each other. Conversely, when this circuit loop is in an open condition, means that there are some parts broken within the package. In the meantime, pay attention to the dimension parameter in the bonding balls. This can ensure whether the bonding quality of the package is superb or not. By referring to this measurement of the dimension parameter, the manufacturer also can improve the yield of their packaging process.

BRIEF DESCRIPTION OF THE DRAWINGS

The present invention will be readily understood by the following detailed description in conjunction with the accompanying drawings.

DETAILED DESCRIPTION OF THE PREFERRED EMBODIMENT

The present invention is described with preferred embodiments and accompanying drawings. It should be appreciated that all the embodiments are merely used for illustration. Although the present invention has been described in term of a preferred embodiment, the invention is not limited to this embodiment. It will be understood, however, to one skilled in the art, that the present invention may be practiced without some or all of these specific details. In other instances, well known process operations have not been described in detail in order not to unnecessary obscure the present invention.

Figure 1:
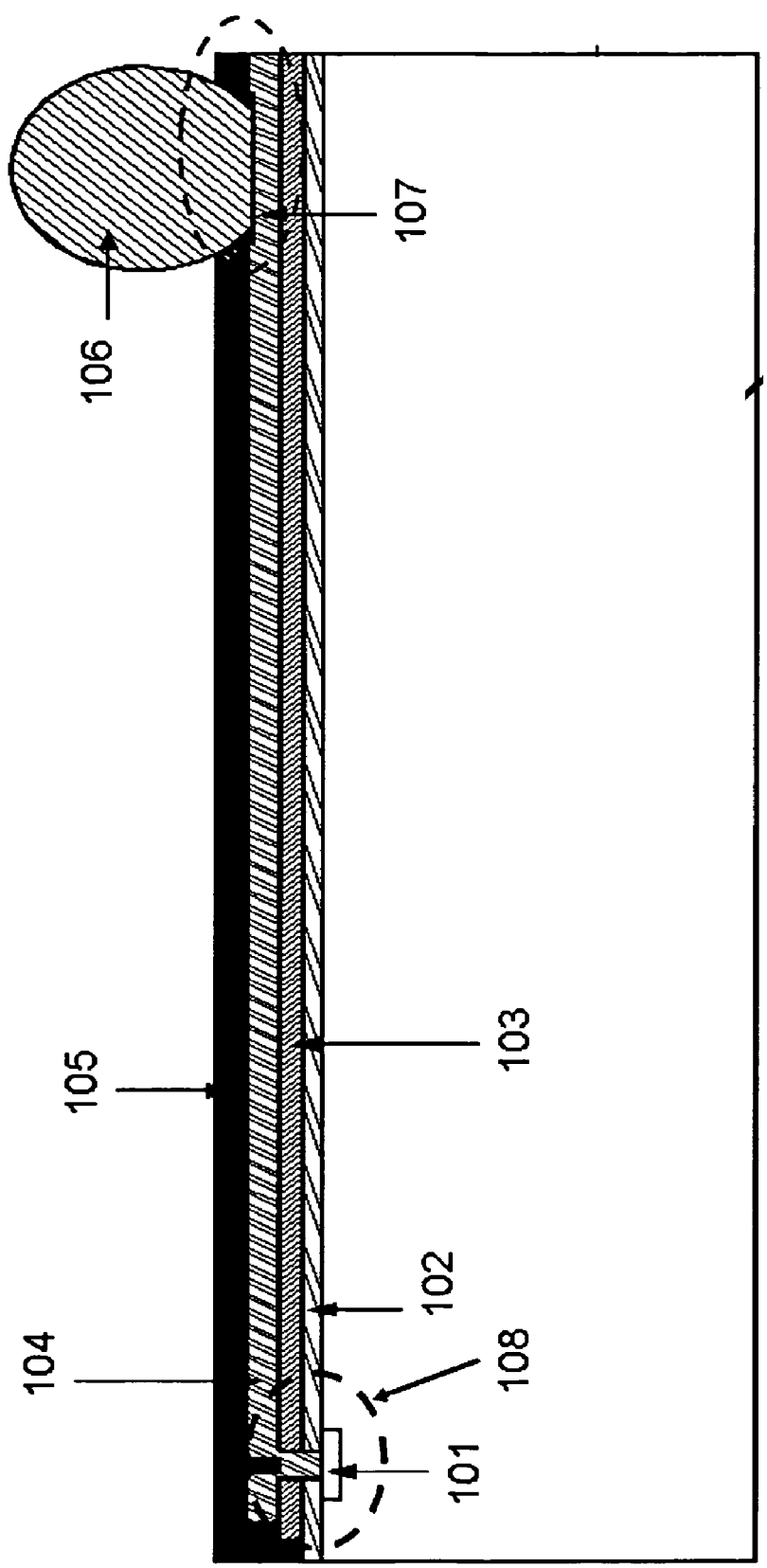
FIG. 1 is a schematic diagram of one of the possible package structure which is used in present invention.

A partial package structure used in one of the preferred embodiments of the present invention is shown in FIG. 1. The package structure comprises an isolation layer 103 and a passivation layer 102 of an IC (integrated circuit) device 100. The material of the isolation layer 103 may be a dielectric layer with a thickness of 5 micron such as BCB, SINR (Siloxane polymer), epoxy, polyimides etc . . . The material of the passivation layer 102 is polyimides or SiN. The trace (redistribution layer, or RDL) 104 is formed over the isolation layer 103, A1 pads 101 of the IC device. The material of the trace (RDL) 104 may be Ti/Cu alloy or Cu/Ni/Au alloy with a thickness of 15 micron. The Ti/Cu alloy may be formed by sputtering technique, the Cu/Ni/Au alloy may be formed by electroplating. Moreover, an isolation layer 105 that covers over the trace (RDL) 104 has a plurality of openings to expose a portion of the trace (RDL) 104. Solder ball 106 is located in each one of the openings to electrically couple with a print circuit board (PCB) or external parts. The material of the isolation layer 105 may be a dielectric layer such as BCB, SINR (Siloxane polymer), epoxy, polyimides etc . . . .

The aforementioned package structure does not need an additional material to intensively fix the solder ball 106. When the solder ball 106 joints to the print circuit board (PCB), the stress may be induced by temperature influence at the joint part between the solder ball 106 and the trace (RDL) 104, it is indicated by the UBM (under bump metallurgy) 107, the solder ball 106 will be cracked owing to reinforcing stress raised by temperature variation. Because the bonding force of UBM 107 which is between trace 104 and solder ball 106 is greater than the reinforcing stress, there is no possibility that the cracking part is the UBM 107. However, the cracking part will be the UBM 108 which is between trace 104 and pad 101. That is the bonding force of UBM 108 much smaller than the bonding force of UBM 107. So there will be an open circuit between the solder ball and pad.

Figure 2:
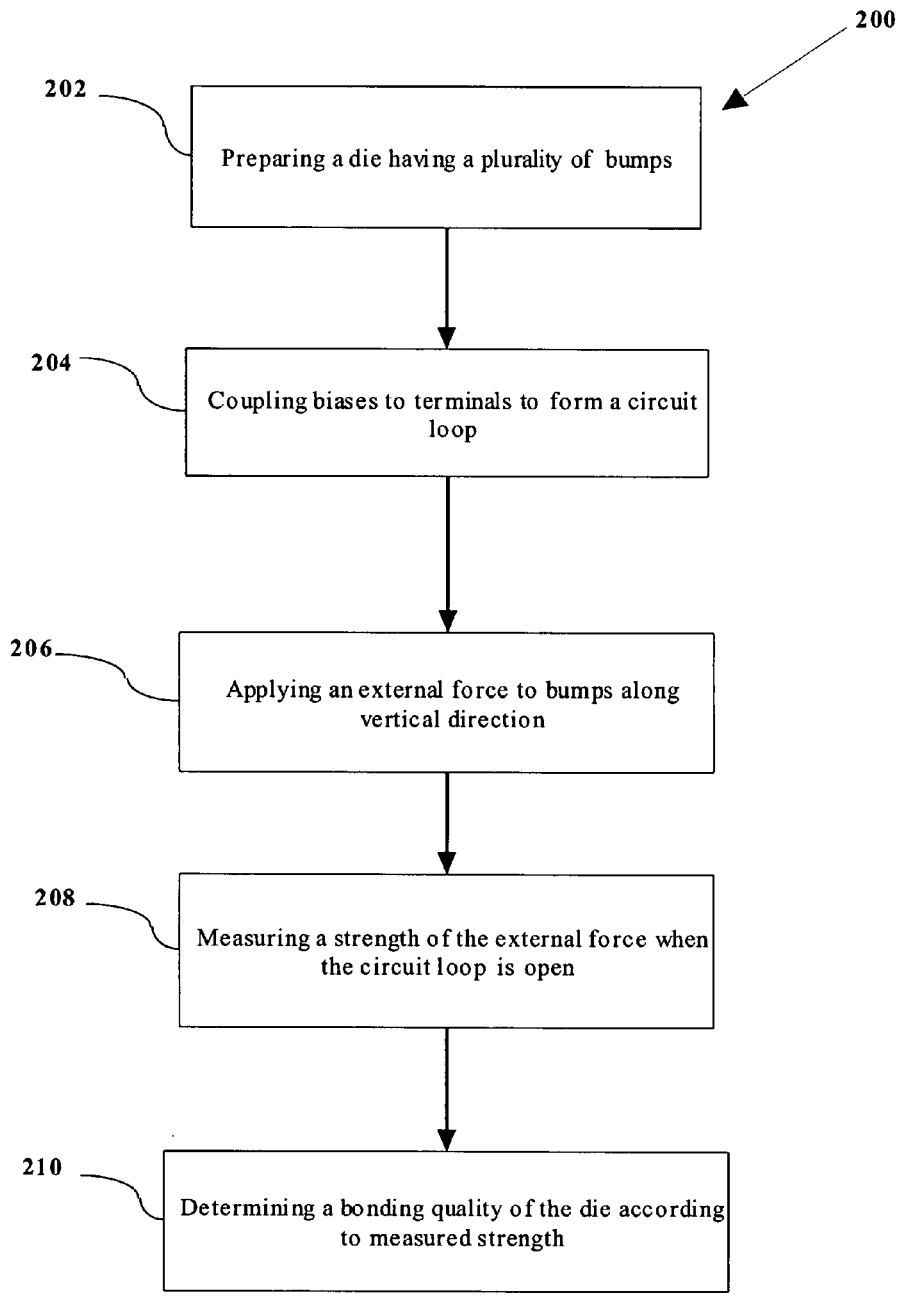
FIG. 2 is a flow chart for Trace Pull Test to determine the bonding quality by measuring the strength of an external force.

Referring to FIG. 2, a procedure of Trace Pull Test method is illustrated in the flow chart. In a preferred embodiment of the present invention, manufacturer can determine the yield of the package by checking the strength which the package can withhold. The process 200 is a combination of essential steps of Trace Pull Test, and the whole process starts with the step 202, which is preparing the die for the test. In the aforementioned description, we already recited the preferred structure of the die which is suitable for the test. But this is not the only type of die which is suitable for the test; we still can use this test on various types of IC, including some future IC, for example a wirebonding BGA package, a Flip-Chip BGA package, PBGA package, LGA package or a fan-in type and fan-out type wafer level packaging (FO-WLP). Then, to the nest step 204 is to couple both biases to terminal to form a circuit loop. The reason for forming this circuit loop is to help the manufacturer to clearly distinguish the good condition from the failure condition. By using the property of the circuit, we can tell a very short time from close circuit to open circuit. The two biases may be connected to a power supply which is/isn't built in the tester, can provide various kinds of electric flows, such as DC in different voltage. The terminals on the die can be the UBM and any nearby conductive part of the die. The UBM mentioned here refers to the UBM between the trace and bonding ball, referring to FIG. 1, the UBM 107 even refers to the bonding ball itself. Alternatively, the UBM refers to the area between the trace and the bonding pad; it can be the UBM 108 in FIG. 1 or any nearyby conductive part. Furthermore, we even can couple the both biases to any pair of the bonding ball on the die in order to check the conductivity between that pair and check the function of the IC. When the circuit loop was successfully established, the subsequent step of the block 206 is initiated. In this step, an external force is applied to the object for test. The object can be the package in the aforementioned type, or any other suitable types of packages. The external force is generated by a Trace Pull Tester, where the Tester may be any designed mechanism or just the Wire Pull Tester. The external force is applied in a vertical direction, so that means we "pull" the bonding ball upward. Because the previous stated biases are connected to a power supply which is/isn't built in the tester, and can provide various kinds of electric flows, such as DC in different voltage the formed circuit can be used to control the generation of the external force. When the formed circuit loop is in open condition (means there are somewhere is cracked in the conductive layer), the tester will stop the external force automatically. Concurrently in step 208, the tester will measure the strength of the external force, and this measurement can represent for the maximum strength which the package can withhold. Besides, the measured strength can be input to another other useful source for further examining. Finally, in step 210, all of the possible way to analyze measured value to analyze measured value to determine the quality of the tested package can be introduced.

Figure 3:
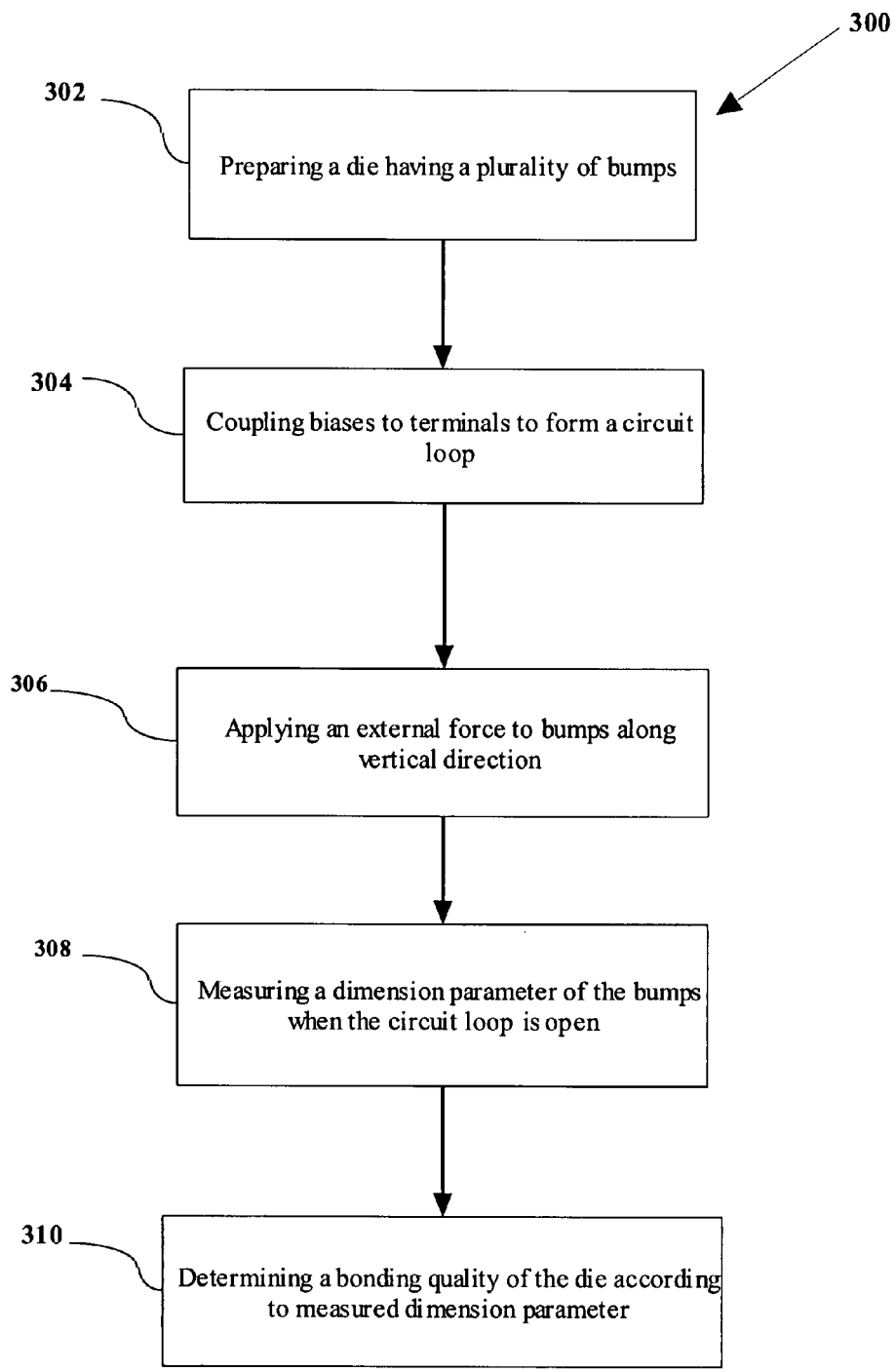
FIG. 3 is a flow chart for Trace Pull Test to determine the bonding quality by measuring the dimension parameter of deformed bumps.

Referring to FIG. 3, a procedure of Trace Pull Test method is illustrated in the flow chart. In another preferred embodiment of the present invention, manufacturer can determine the yield of the package by checking whether the length variation is exceeded the tolerance or not. The process 300 is a combination of essential steps of Trace Pull Test, and the whole process starts with the step 302, which is preparing the die for the test. In the aforementioned description, we already recited the preferred structure of the die which is suitable for the test. But this is not the only type of die which is suitable for the test; we still can apply the present invention on various types of IC, including some future IC, for example a wirebonding BGA package, a Flip-Chip BGA package, PBGA package, LGA package or a fan-in type and fan-out type wafer level packaging (FO-WLP). Then we go to step 304 to couple both biases to terminal to form a circuit loop. The reason for forming this circuit loop is helping the manufacturer to clearly distinguish the good condition from the failure condition. By using the property of the circuit, we can tell a very short time from close circuit to open circuit. The two biases may be connected to a power supply which is/isn't built in the tester, can provide various kinds of electric flows, such as DC in different voltage. The terminals on the die can be the UBM and any nearby conductive part of the die. The UBM we mentioned here refers to the UBM between the trace and bonding ball, referring back to FIG. 1, UBM is the UBM 107 and even the bonding ball itself. Alternatively, the UBM refers to the area between the trace and the bonding pad; it can be the UBM 108 in FIG. 1 and ever conductive part nearby. Furthermore, we even can couple the both biases to any pair of the bonding ball on the die in order to check the conductivity between that pair and check the function of the IC. When the circuit loop is successfully established, we can step to the block 306. In this step, an external force is applied to the object for test. The object can be the package in the aforementioned type, or any other suitable types of packages. The external force is supplied by a Trace Pull Tester, where the Tester may be a whole new designed mechanism or just the Wire Pull Tester. The external force is applied in a vertical direction, so that means we "pull" the bonding ball upward. Under such procedure, the solder ball is deformed and the length (such as the diameter) of the solder ball is extended. In the meantime, in step 308, the dimension parameter (the length or the diameter) of deformed solder ball can be determined or measured. Although the dimension parameter of the solder ball has its' limitation or tolerance, it still can be a useful criterion. For example, when the length is up to a predetermined parameter, it means the bonding quality of the package is superb. Because there is impossible the solder ball can be deformed into such way without any other external force. In step 310, the next step is to analyze the deformed level to determine whether the bonding quality of the tested package is good or not.

Figure 4:
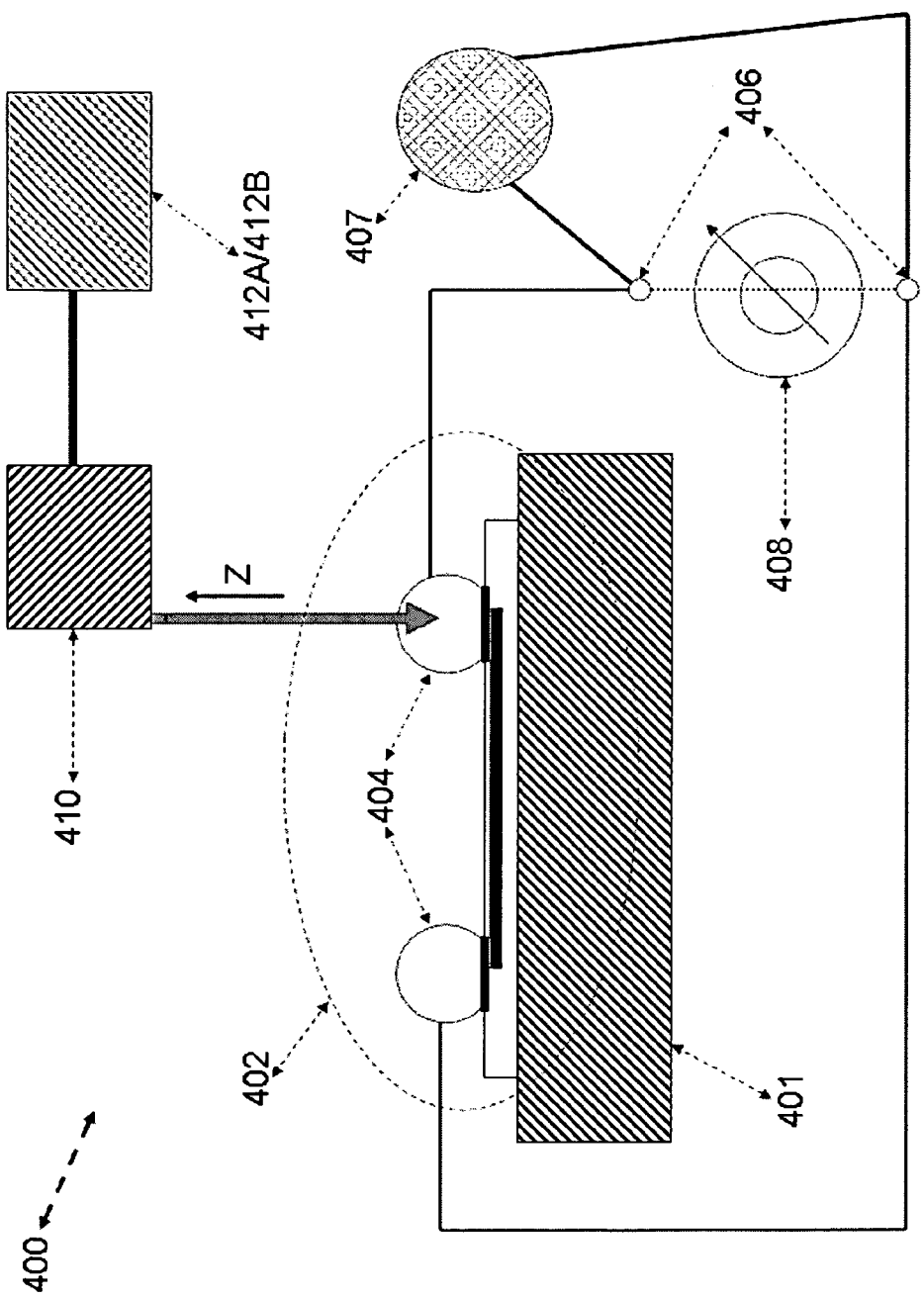
FIG. 4 is a block diagram illustrating a system of Trace Pull Test.

Referring to FIG. 4, a system of Trace Pull Test is illustrated in a block diagram. A system 400 is one of preferred embodiments of Trace Pull Test, and it should be considered exemplary. The system 400 includes a carrier 401 for carrying an IC package 402 that is the under testing objective, and it can be various types of packages. In this preferred embodiment, the IC package 402 includes but not limited to the FO-WLP (a fan-in type and fan-out type wafer level packaging). The possible types of package include a wirebonding BGA package, a Flip-Chip BGA package, PBGA package, LGA package or a fan-in type and fan-out type wafer level packaging (FO-WLP). The bumps 404 are solder balls on the IC package 402, also can be the "wire" on wirebonding package or other conductive parts of different packages. These bumps of the package are used for coupling to the biases 406, subsequently. Operator will choose a pair of bumps which are connected with trace (RDL) within the package, coupling two biases 406 that are in opposite electricity to each other. By coupling both biases to the IC package 402, it will form a circuit loop. A resistance meter 408 is located between the biases 406 for monitoring the status of formed circuit loop, and when measured resistance value is infinite, means the circuit loop is in "open" condition. The testing system 400 includes a tester 410 with coupling device used to couple the testing objective. The main function of tester 410 is to apply an external force on the testing objective along substantially vertical direction which is direction Z in the FIG. 4. The tester 410 may be a Trace Pull Tester, a Wire Pull Tester, a modified Ball Shear Tester, or newly designed tester. The biases 406 are provided by a power supply 407, which is/isn't built in the tester 410, can provide various kinds of electric flows, such as DC in different voltage. The force/length meter 412A, 412B is coupled to the tester 410, in order to determine the changing status of the tested objective when the circuit loop is in "open" condition. The tester 410 may be controlled by some controller which is not illustrated in the picture, where the controller will receive the status of circuit loop from the resistance meter 408, and accords to this status to determine when to stop applying the external force on testing objective. This controller may also be used to control the force/length 412A, 412B meter, in order to record the accurate value of measured data when the circuit loop is in "open" condition. Under all these measured values, manufacturer can verify their yield of packaging process, and moreover improve their packaging qualities.

Other embodiments of the invention will be apparent to those skilled in the art from consideration of the specification and practice of the invention. The word "comprising" and forms of the word "comprising" as used in the description and in the claims are not meant to exclude variants or additions to the invention. Furthermore, certain terminology has been used for the purposes of descriptive clarity, and not to limit the present invention. The embodiments and preferred features described above should be considered exemplary, with the invention being defined by the appended claims.

We claim:

1. A method of RDL Trace Pull Test for a package, the method comprising following steps:
 preparing a die having a plurality of bumps;
 coupling a first bias to a first terminal of said die and coupling a second bias to a second terminal of said die to form a circuit loop;
 applying an external force to said bumps along substantially a vertical direction;
 measuring a strength of said external force when said circuit loop is open;
 determining a bonding quality of said die according to said strength; and
 selecting good RDL Trace according to said bonding quality.

2. The method of claim 1, wherein said package comprises a wire-bonding BGA package, a Flip-Chip BGA package, PBGA package, LGA package or a fan-in type and fan-out type wafer level packaging (FO-WLP).

3. The method of claim 1, wherein said bumps comprise solder balls.

4. The method of claim 1, wherein said first terminal includes said bumps or UBM (under bump metallurgy) between said bumps and said RDL trace.

5. The method of claim 1, wherein said second terminal can be UBM (under bump metallurgy) between said RDL trace and a bonding pad.

6. The method of claim 1, wherein said first bias is electrically positive or electrically negative.

7. The method of claim 1, wherein said second bias is electrically positive when said first bias is electrically negative electricity, and is electrically negative when said first bias is electrically positive.

8. A method of RDL Trace Pull Test in dimension parameter for a package, the method comprising following steps:
 preparing a die having a plurality of bumps;
 coupling a first bias to a first terminal of said die and coupling a second bias to a second terminal of said die to form a circuit loop;
 applying an external force to said bumps along substantially vertical direction;

measuring a dimension parameter of said bumps when said circuit loop is open;

determining a bonding quality of said die according to said dimension parameter, and selecting good RDL Trace according to said bonding quality of said die.

9. The method of claim 8, wherein said package comprises a wire-bonding BGA package, a Flip-Chip BGA package, PBGA package, LGA package or a fan-in type and fan-out type wafer level packaging (FO-WLP).

10. The method of claim 8, wherein said bumps comprise solder balls.

11. The method of claim 8, wherein said first terminal includes said bumps or UBM between said bumps and said RDL trace.

12. The method of claim 8, wherein said second terminal includes UBM between said RDL trace and a bonding pad.

13. The method of claim 8, wherein said first bias is electrically positive or electrically negative.

14. The method of claim 8, wherein said second bias is electrically positive when said first bias is electrically negative, and is electrically negative when said first bias is electrically positive.

* * * * *